(12) United States Patent
Wang et al.

(10) Patent No.: US 11,476,971 B2
(45) Date of Patent: Oct. 18, 2022

(54) ENCODING METHOD AND APPARATUS, ELECTRONIC DEVICE AND STORAGE MEDIUM

(71) Applicant: CHINA ACADEMY OF TELECOMMUNICATIONS TECHNOLOGY, Beijing (CN)

(72) Inventors: Jiaqing Wang, Beijing (CN); Fang-Chen Cheng, Beijing (CN); Di Zhang, Beijing (CN); Shaohui Sun, Beijing (CN)

(73) Assignee: Datang Mobile Communications Equipment Co., Ltd., Beijing (CN)

( * ) Notice: Subject to any disclaimer, the term of this patent is extended or adjusted under 35 U.S.C. 154(b) by 185 days.

(21) Appl. No.: 16/766,734

(22) PCT Filed: Aug. 29, 2018

(86) PCT No.: PCT/CN2018/103089
§ 371 (c)(1),
(2) Date: May 25, 2020

(87) PCT Pub. No.: WO2019/100795
PCT Pub. Date: May 31, 2019

(65) Prior Publication Data
US 2020/0389249 A1 Dec. 10, 2020

(30) Foreign Application Priority Data
Nov. 24, 2017 (CN) .......................... 201711192729.3

(51) Int. Cl.
H04W 4/00 (2018.01)
H04L 1/00 (2006.01)
(Continued)

(52) U.S. Cl.
CPC .......... *H04L 1/0002* (2013.01); *H03M 13/09* (2013.01); *H03M 13/13* (2013.01); *H03M 13/253* (2013.01)

(58) Field of Classification Search
CPC ... H04L 1/0002; H04L 1/0057; H04L 1/0064; H04L 1/0073; H04L 1/001; H04L 1/0041;
(Continued)

(56) References Cited

U.S. PATENT DOCUMENTS 9,380,490 B2 * 6/2016 Akkarakaran ........ H04L 1/0001
9,526,089 B2 * 12/2016 Jang ........................ H04L 1/003
(Continued)

FOREIGN PATENT DOCUMENTS

CN 101667884 A 3/2010
CN 101809885 A 8/2010
(Continued)

OTHER PUBLICATIONS

ETSI TS 138 212 v15.2.0 (Jul. 2018), 5G; NR; Multiplexing and Channel Coding (3GPP TS 38.212 version 15.2.0 Release 15), pp. 10-32. (Year: 2018).*
(Continued)

*Primary Examiner* — Phuongchau Ba Nguyen
(74) *Attorney, Agent, or Firm* — Meunier Carlin & Curfman LLC

(57) ABSTRACT

An encoding method and apparatus, an electronic device and a storage medium are provided. The method includes: determining a target quantity of segments of a sequence to be coded according to a length of the sequence to be coded and a transmission code rate; performing segmentation on the sequence to be coded according to the target quantity; coding each sub-sequence obtained after segmentation, and concatenating sub-sequences after coding.

17 Claims, 7 Drawing Sheets

(51) Int. Cl.
H03M 13/09 (2006.01)
H03M 13/13 (2006.01)
H03M 13/25 (2006.01)

(58) Field of Classification Search
CPC .... H04L 1/0056; H04L 5/0007; H03M 13/09; H03M 13/13; H03M 13/253; H04W 28/04; H04W 72/04; H04W 72/042; H04W 88/08
See application file for complete search history.

(56) References Cited

U.S. PATENT DOCUMENTS

| | | | |
|---|---|---|---|
| 10,666,391 B2* | 5/2020 | Xu | H04L 1/0071 |
| 10,666,394 B2* | 5/2020 | Sugaya | H04W 28/04 |
| 11,012,185 B2* | 5/2021 | Jeong | H04L 1/0067 |
| 2013/0077595 A1 | 3/2013 | Aiba et al. | |
| 2019/0312678 A1* | 10/2019 | Yokomakura | H04L 1/0071 |
| 2020/0021396 A1* | 1/2020 | Ma | H03M 13/155 |
| 2020/0099399 A1* | 3/2020 | Xie | H03M 13/136 |
| 2020/0228237 A1* | 7/2020 | Myung | H04L 1/0061 |
| 2020/0235847 A1* | 7/2020 | Wang | H04L 1/0057 |

FOREIGN PATENT DOCUMENTS

| | | | |
|---|---|---|---|
| CN | 102318222 A | 1/2012 | |
| CN | 108631941 A1* | 10/2018 | H04L 1/0058 |
| JP | 2011244509 A | 12/2011 | |
| JP | 2016213871 A | 12/2016 | |
| WO | 2009041783 A1 | 4/2009 | |
| WO | 2014207895 A1 | 12/2014 | |
| WO | 2017131813 A1 | 8/2017 | |

OTHER PUBLICATIONS

Interdigital Inc, "Code Block Segmentation for Data Channel", R1-1710958, 3GPP TSG RAN WG1 NR Ad-Hoc #2, Qingdao, P.R. China Jun. 27-30, 2017.
ZTE, Sanechips, "Segmentation of Polar Code for Large UCI", R1-1718914, 3GPP TSG RAN WG1 Meeting #90bis, Prague, Czechia, Oct. 9-13, 2017.
International Search Report and Written Opinion issued by the International Searching Authority (ISA/CN in PCT Application No. PCT/CN2018/103089 dated Nov. 1, 2018. 9 pages, including English translation of International Search Report.
Samsung. Details of Conditions for UCI Segmentation. R1-1720356. 3GPP TSG RAN WG1 Meeting #91, Reno, NV, Nov. 17, 2017. 9 pages.
Shinde, et al., "A Stero Video Coding Scheme Using a Waveform in a Reference Bloc." Sci and Tech Res Lab, 1997, NHK, pp. 93-94. English Abstract included in text.

* cited by examiner

ENCODING METHOD AND APPARATUS, ELECTRONIC DEVICE AND STORAGE MEDIUM

CROSS REFERENCE TO RELATED APPLICATIONS

The present application is a US National Stage of International Application No. PCT/CN2018/103089, filed on Aug. 29, 2018, which claims priority from Chinese Patent Application No. 201711192729.3, filed with the Chinese Patent Office on Nov. 24, 2017 and entitled "Encoding Method and Apparatus, Electronic Device and Storage Medium", which is hereby incorporated by reference in its entirety.

FIELD

The present application relates to the field of communication technologies, and particularly to a coding method and apparatus, an electronic device and a storage medium.

BACKGROUND

Polar codes, which is the control channel coding scheme in the eMBB (Enhanced Mobile Broad Band) scenario for the fifth generation mobile communication technology (5th-Generation, 5G), is a new coding scheme that can achieve the binary symmetric channel capacity, and has the excellent decoding performance.

However, when the mother code length is larger, the polar code has a larger storage capacity and latency. As such, the 5G technology defines that the maximum mother code length of the polar codes is 512 bits for the downlink transmission and is 1024 bits for the uplink transmission. However, due to the impact of Massive Multiple-Input Multiple-Output (Massive MIMO) technology, the length of the information sequence of the Uplink Control Information (UCI) has increased dramatically.

For a single carrier, the UCI is of at most 543 bits, and the 5G may support the UCI of up to 16 carriers to be transmitted on an uplink carrier. Thus, the length of the UCI that needs to be transmitted by one carrier may be 543*16=8688 bits. However, the 8688 bits far exceeds the maximum mother code length (1024 bits) of the polar codes for the uplink transmission, so it is necessary to study how to code and transmit the UCI for multi-carrier aggregation.

In order to solve the problem that performance of the polar codes seriously reduces when the UCI with larger length is at medium and low bit rates, the method in prior art is to divide the information sequence with larger length into two segments at an appropriate bit rate, where the polar coding is performed on two segments of information sequences respectively by using the maximum mother code of 1024. It is assumed that the UCI payload size=512 and the polar code rate is ⅙, then the total number of coded bits is 512*6=3072 bits.

According to the existing protocols, there is a need to perform the repetition according to the maximum polar mother code length of 1024 to obtain 3072 bits, and the true non-repetitive code rate is only 512/1024=½, which will undoubtedly significantly reduce the performance of the uplink control channel. Therefore, it is necessary to divide the first length of the payload into two segments at first, i.e., 512/2=256 bits, and the 256 bits are coded by using the polar mother codes of Nmax=1024 to obtain 1024 bits, so that 2048 coded bits is got for the payload of 512 bits and then repeated to 3072 bits. At this time, the non-repetitive actual code rate is 256/1024=¼, which may significantly improve the performance compared with R=½.

FIG. 1 is a method of performing polar coding on the segments of the UCI in the prior art. Firstly a CRC sequence is attached behind the UCI information sequence (information bits) to obtain the UCI payload, then the code block segmentation is performed on the UCI payload, the polar coding is performed on the payload divided into two segments, the rate matching operation is performed respectively on the coded blocks, and finally the code block concatenation is performed to get the final output. In the UCI segmentation shown in FIG. 1, multiple segments of UCI may have only one CRC, or multiple segments need to be decoded to obtain the candidate paths every time the decoding is performed, and they need to be combined to use this CRC for checking.

FIG. 2 is another method of performing polar coding on the segments of the UCI in the prior art. The code block segmentation is performed on the UCI information sequence (information bits) at first, where each segment is attached with a CRC sequence of L bits, then the polar coding is performed on each segment of bit stream added with the CRC, the rate matching operation is performed respectively on coded blocks, and the code block concatenation is performed to get the final output. In the method shown in FIG. 2, during decoding, each segment of polar codes may be checked respectively according to its corresponding CRC. The CRC overhead is doubled. According to the current standard, the CRC is of at least 11 bits, so it significantly reduces the system performance, but also has the advantages of simple decoding and easy operation.

At present, all the discussions are based on the single-carrier coding scheme, or the coding method when the multiple carriers are divided into only two segments. There is no solution on how to flexibly segment, especially when the number of bits to be coded is greater than the maximum information sequence length allowed during coding.

SUMMARY

The embodiments of the present application provide a coding method and apparatus, an electronic device and a storage medium, so as to solve the problem of non-flexible segmentation of the sequence to be coded in the prior art.

In order to achieve the above-mentioned purpose, an embodiment of the present application discloses a coding method. The method includes:
  determining a target number of segments of a sequence to be coded according to a length of the sequence to be coded and a transmission code rate;
  performing segmentation on the sequence to be coded according to the target number;
  coding each sub-sequence obtained after segmenting, and concatenating sub-sequences after coding.

Optionally, the determining a target number of segments of a sequence to be coded according to a length of the sequence to be coded and a transmission code rate, includes:
  determining the target number of segments of the sequence to be coded according to the length of the sequence to be coded, the transmission code rate and a preset first function.

Optionally, the preset first function includes:
  an integer of $N=a1*K/g(R)$, where the $g(R)$ is a linear function or a nonlinear function, $a1$ is a first scaling factor, K is the length of the sequence to be coded, R is the transmission code rate, and N is the target number.

Optionally, when the g(R) is a linear function, the g(R)=c1*R+b1, where c1 is a maximum bit length to be coded, and b1 is a preset first offset value.

Optionally, when the g(R) is a nonlinear function, the $g(R)=c2*(A_i*R^i+A_{i-1}R^{i-1}+ \ldots +A_1R)+b2$, where c2 is a maximum bit length to be coded, b2 is a preset second offset value, i is a preset constant not less than 2, and $A_i$-$A_1$ are preset constants.

Optionally, before performing segmentation on the sequence to be coded according to the target number, the method includes:
  determining a temporary value according to the length of the sequence to be coded and the target number;
  determining a proportional threshold corresponding to the transmission code rate according to the transmission code rate;
  determining whether the temporary value is greater than or equal to the proportional threshold;
  in response to determining that the temporary value is greater than or equal to the proportional threshold, proceeding to a next step.

Optionally, said that determining a temporary value according to the length of the sequence to be coded and the target number, includes:
  determining a second number according to the target number and a preset first numerical value, and determining a ratio of the length of the sequence to be coded to the second number as the temporary value; or
  determining a second ratio of the length of the sequence to be coded to the target number, and determining a product of the second ratio and a preset second scaling factor as the temporary value.

Optionally, the first numerical value is 1.

Optionally, if the temporary value is less than the proportional threshold, before performing segmentation on the sequence to be coded according to the target number, the method further includes:
  adjusting the target number.

Optionally, said that determining a proportional threshold corresponding to the transmission code rate according to the transmission code rate includes:
  if the transmission code rate is less than a preset first code rate threshold, determining that the proportional threshold corresponding to the transmission code rate is a preset value.

Optionally, said that determining a proportional threshold corresponding to the transmission code rate according to the transmission code rate includes:
  determining the proportional threshold corresponding to the transmission code rate according to the transmission code rate and a preset second function.

Optionally, said that determining the proportional threshold corresponding to the transmission code rate according to the transmission code rate and a preset second function, includes:
  if the transmission code rate is not less than a preset second code rate threshold, determining the proportional threshold according to the transmission code rate and a preset linear function c3*R+b3 or int (c3*R+b3), wherein c3 is the maximum bit length to be coded, b3 is a preset third offset value, R is the transmission code rate, and int is rounding.

Optionally, said that determining the proportional threshold corresponding to the transmission code rate according to the transmission code rate and a preset second function, includes:
  if the transmission code rate is not less than a preset third code rate threshold and less than a preset fourth bit rate threshold, determining the proportional threshold according to the transmission code rate and a preset linear function c4*R+b4 or int (c4*R+b4), wherein c4 is the maximum bit length to be coded, b4 is a preset fourth offset value, R is the transmission code rate, and int is rounding.

Optionally, the scaling factor is greater than 0 and less than or equal to 1.

Optionally, the offset value is greater than −150 and less than 200.

Optionally, said that performing segmentation on the sequence to be coded according to the target number includes:
  determining a target sequence according to the sequence to be coded;
  segmenting the target sequence according to the target number, wherein the target sequence is an information sequence, or a sequence composed of an information sequence and a Cyclic Redundancy Check (CRC) sequence.

Optionally, the segmentation includes:
  uniform segmentation; or
  non-uniform segmentation; or
  uniform segmentation after zero padding.

An embodiment of the present application discloses a coding apparatus. The apparatus includes:
  a determining module configured to determine a target number of segments of a sequence to be coded according to a length of the sequence to be coded and a transmission code rate;
  a segmentation module configured to perform segmentation on the sequence to be coded according to the target number;
  a coding module configured to code each sub-sequence obtained after segmenting, and concatenate sub-sequences after coding.

An embodiment of the present application discloses an electronic device. The electronic device includes: a memory and a processor;
  the processor is configured to read programs in the memory to perform the process of:
    determining a target number of segments of a sequence to be coded according to a length of the sequence to be coded and a transmission code rate;
    performing segmentation on the sequence to be coded according to the target number;
    coding each sub-sequence obtained after segmenting, and concatenating sub-sequences after coding.

Optionally, the processor is specifically configured to: determine the target number of segments of the sequence to be coded according to the length of the sequence to be coded, the transmission code rate and a preset first function.

Optionally, the processor is further configured to: determine a temporary value according to the length of the sequence to be coded and the target number before segmenting the sequence to be coded according to the target number; determine a proportional threshold corresponding to the transmission code rate according to the transmission code rate; determine whether the temporary value is greater than or equal to the proportional threshold; if so, proceed to a next step.

Optionally, the processor is specifically configured to: determine a second number according to the target number and a preset first numerical value, and determine a ratio of the length of the sequence to be coded to the second number as the temporary value; or determine a second ratio of the length of the sequence to be coded to the target number, and determine a product of the second ratio and a preset second scaling factor as the temporary value.

Optionally, the processor is further configured to: adjust the target number before segmenting the sequence to be coded according to the target number if the temporary value is less than the proportional threshold.

Optionally, the processor is specifically configured to: determine that the proportional threshold corresponding to the transmission code rate is a preset value if the transmission code rate is less than a preset first code rate threshold.

Optionally, the processor is specifically configured to: determine the proportional threshold corresponding to the transmission code rate according to the transmission code rate and a preset second function.

Optionally, the processor is specifically configured to: determine the proportional threshold according to the transmission code rate and a preset linear function c3*R+b3 or int (c3*R+b3) if the transmission code rate is not less than a preset second code rate threshold, where c3 is the maximum bit length to be coded, b3 is a preset third offset value, R is the transmission code rate, and int is rounding.

Optionally, the processor is specifically configured to: determine the proportional threshold according to the transmission code rate and a preset linear function c4*R+b4 or int (c4*R+b4) if the transmission code rate is not less than a preset third code rate threshold and less than a preset fourth bit rate threshold, where c4 is the maximum bit length to be coded, b4 is a preset fourth offset value, R is the transmission code rate, and int is rounding.

Optionally, the processor is specifically configured to: determine a target sequence according to the sequence to be coded; and segment the target sequence according to the target number, wherein the target sequence is an information sequence, or a sequence composed of an information sequence and a CRC sequence.

An embodiment of the present application discloses a computer readable storage medium that stores a computer program executable by an electronic device, where the program causes the electronic device to perform steps of any one of the above-mentioned coding methods when running on the electronic device.

The embodiments of the present application provide a coding method and apparatus, an electronic device and a storage medium, so as to solve the problem of non-flexible segmentation of the sequence to be coded in the prior art. The method includes: determining a target number of segments of a sequence to be coded according to a length of the sequence to be coded and a transmission code rate; segmenting the sequence to be coded according to the target number; coding each sub-sequence after segmenting, and concatenating sub-sequences after coding. In the embodiments of the present application, the target number of segments of the sequence to be coded is determined according to the length of the sequence to be coded and the transmission code rate, and the sequence to be coded is segmented according to the target number. The sequence to be coded is flexibly segmented to improve the coding performance.

BRIEF DESCRIPTION OF THE DRAWINGS

In order to illustrate the embodiments of the present application or the technical solutions in the prior art more clearly, the accompanying figures which need to be used in describing the embodiments or the prior art will be introduced below briefly. Obviously the accompanying figures described below are some embodiments of the present application, and other accompanying figures can also be obtained by those ordinary skilled in the art according to these accompanying figures without creative labor.

DETAILED DESCRIPTION OF THE EMBODIMENTS

In order to flexibly segment the sequence to be coded, the embodiments of the present application provide a coding method and apparatus, an electronic device and a storage medium.

The technical solutions in the embodiments of the present application will be described clearly and completely below in combination with the accompanying drawings in the embodiments of the present application. Obviously the described embodiments are only a part of the embodiments of the present application but not all the embodiments. Based upon the embodiments of the present application, all of other embodiments obtained by those ordinary skilled in the art without creative work pertain to the protection scope of the present application.

Figure 1:
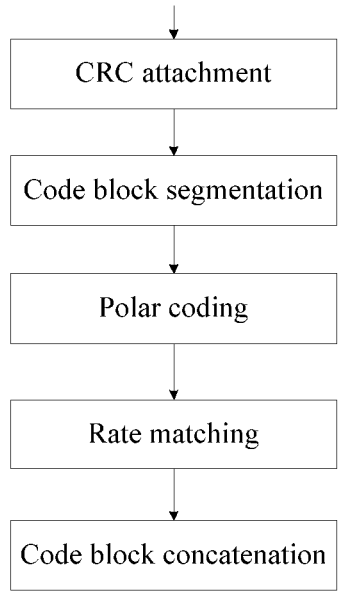
FIG. 1 is a schematic diagram of a UCI segmentation for polar coding in the prior art.
Figure 2:
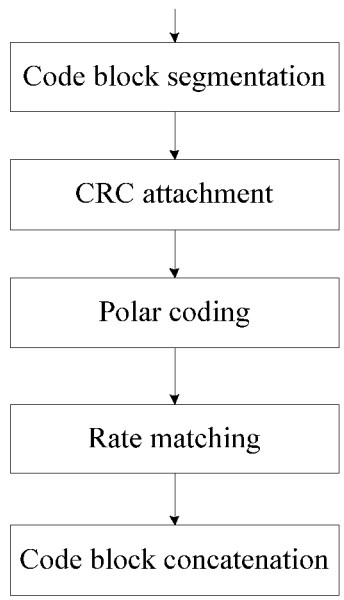
FIG. 2 is a schematic diagram of a UCI segmentation for polar coding in the prior art.
Figure 3:
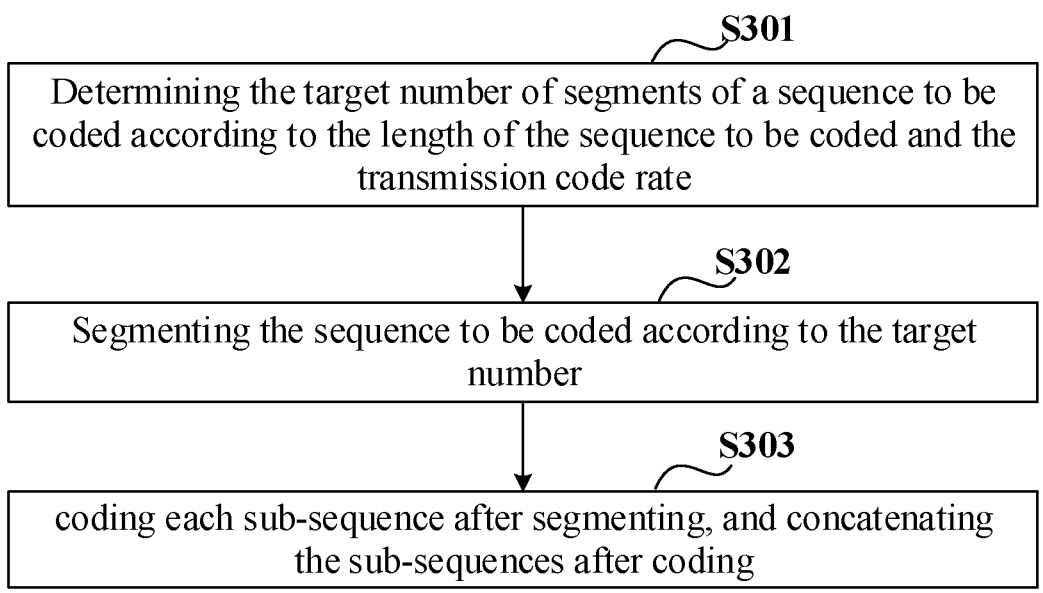
FIG. 3 is a schematic diagram of a coding process provided by an embodiment of the present application.

FIG. 3 is a schematic diagram of a coding process provided by an embodiment of the present application. The process includes the following steps.

S301: determining the target number of segments of a sequence to be coded according to the length of the sequence to be coded and the transmission code rate.

S302: segmenting the sequence to be coded according to the target number.

S303: coding each sub-sequence obtained by segmenting, and concatenating the sub-sequences after coding.

The coding method provided by the embodiment of the present application is applied to the sending end, and specifically, the sending end may be a base station or a UE (User Equipment).

There is a sequence to be coded at the sending end, and the present application intends to segment said sequence, and codes each sub-sequence obtained by the segmentation to improve the coding performance. The sending end knows what transmission code rate R it uses to transmit the bit stream.

To segment the sequence to be coded, firstly the number of segments of the sequence to be coded should be determined, which is referred to as the target number. It is possible to determine the target number of segments of the sequence to be coded according to the length of the sequence to be coded and the transmission code rate, where the target number is a positive integer.

After the target number is determined, the sequence to be coded may be segmented according to the target number. When the segmentation is performed, it may be uniform segmentation or non-uniform segmentation.

In an embodiment of the present application, the sequence to be coded may be an information sequence including the UCI, or may be an information sequence including the UCI and a CRC sequence used for checking. That is, the sequence to be coded is the obtained UCI payload. The transmission code rate (R) is the ratio of the length (K) of the sequence to be coded to the length (M) of the sequence obtained after performing the polar coding and rate matching on the sequence to be coded, that is, R=K/M.

After the sequence to be coded is segmented, each sub-sequence after the segmentation is determined, the sub-sequence can be coded to obtain each code block, and multiple code blocks obtained after coding can be concatenated to obtain the entire coded bit stream.

In the embodiments of the present application, the target number of segments of the sequence to be coded is determined according to the length of the sequence to be coded and the transmission code rate, and the sequence to be coded is segmented according to the target number. The sequence to be coded is flexibly segmented to improve the coding performance.

First Embodiment:

In the embodiment of the present application, in order to determine the number of segments more flexibly and reasonably, said that determining the target number of segments of the sequence to be coded according to the length of the sequence to be coded and the transmission code rate includes:

determining the target number of segments of the sequence to be coded according to the length of the sequence to be coded, the transmission code rate and a preset first function.

Specifically, the preset first function is stored in the sending end. When determining the target number of segments of the sequence to be coded according to the length of the sequence to be coded and the transmission code rate, it is possible to determine the target number of segments of the sequence to be coded according to the length of the sequence to be coded, the transmission code rate and the preset first function.

The first function stored in the sending end may include a sub-function related to the length of the sequence to be coded and the transmission code rate, where the sub-function is g(R). The preset first function may be N=int (a1*K/g(R)) or N=ceiling (a1*K/g(R)), where g(R) is a function related to the transmission code rate R. Here g(R) is a linear function or a non-linear function, a1 is a first scaling factor, K is the length of the sequence to be coded, R is the transmission code rate of the sequence to be coded, and N is the target number.

In the embodiment of the present application, the first function may be an integer of a1*K/g(R). Specifically, it is possible to round down a1*K/g(R), then the first function is N=int(a1*K/g(R)); or it is possible to round up a1*K/g(R), then the first function is N=ceiling(a1*K/g(R)). Here a1 is the first scaling factor, and the range of the first scaling factor is greater than 0 and less than or equal to 1. K is the length of the sequence to be coded, and R is the transmission code rate of the sequence to be coded.

The above-mentioned g(R) may be a linear function, or g(R) may be a non-linear function.

When g(R) is a linear function, it may be g(R)=c1*R+b1, where c1 is the maximum bit length to be coded, and b1 is the preset first offset value.

Preferably, the range of the first offset value is greater than −150 and less than 200. If the embodiment of the present application is the coding method of polar codes, c1 is the maximum mother code length, which may be 1024 bits.

Furthermore, in an embodiment of the present application, when g(R) is a linear function, N=ceiling(a*K/g(R)).

Because the values of a1 and b1 vary, the corresponding linear function g(R) varies, and the corresponding first function also varies. Different values of a1 and b1 will be illustrated below in different cases. In a case that the first function is N=ceiling(a1*K/g(R)), g(R)=c1*R+b1:

when a1 is not 1 and b1 is not 0, specifically, the target number N=ceiling(a1*K/(c1*R+b1));

when a1 is not 1 and b1 is 0, specifically, the target number N=ceiling(a1*K/(c1*R));

when a1 is 1 and b1 is not 0, specifically, the target number N=ceiling(K/(c1*R+1));

when a1 is 1 and b1 is 0, specifically, the target number N=ceiling(K/(c1*R)).

In a case that the first function is N=int(a1*K/g(R)), the specific target number is similar to the above, and will not be repeated here.

When g(R) is a nonlinear function, it may be that g(R)=c2*($A_i$*$R^i$+$A_{i-1}$$R^{i-1}$+ . . . +$A_1$R)+b2, where c2 is the maximum bit length to be coded, b2 is the preset second offset value, i is a preset constant not less than 2, and $A_i$–$A_1$ are preset constants. If the embodiment of the present application is the coding method of polar codes, c2 is the maximum mother code length, which may be 1024 bits. The above-mentioned $A_i$ to $A_1$ are preset constants, and any one or more of $A_i$ to $A_1$ may be 0 or may not be 0.

Furthermore, in an embodiment of the present application, when g(R) is a non-linear function, N=ceiling(a1*K/(c2*($A_i$*$R^i$+$A_{i-1}$$R^{i-1}$+ . . . +$A_1$R)+b2)).

Because the values of a1 and b2 vary, the corresponding nonlinear function g(R) varies, and the corresponding first function also varies. Different values of a1 and b2 will be illustrated below in different cases.

When a1 is not 1 and b2 is not 0, specifically, the target number N=ceiling(a1*K/(c2*($A_i$*$R^i$+$A_{i-1}$$R^{i-1}$+ . . . +$A_1$R)+b2));

when a1 is not 1 and b2 is 0, specifically, the target number N=ceiling(a1*K/(c2*($A_i$*$R^i$+$A_{i-1}$$R^{i-1}$+ . . . +$A_1$R)));

when a1 is 1 and b2 is not 0, specifically, the target number N=ceiling(*K/(c2*($A_i$*$R^i$+$A_{i-1}$$R^{i-1}$+ . . . +$A_1$R)+b2));

when a1 is 1 and b2 is 0, specifically, the target number N=ceiling(*K/(c2*($A_i$*$R^i$+$A_{i-1}$$R^{i-1}$+ . . . +$A_1$R))).

The above-mentioned $A_i$ to $A_1$ are preset constants, and the constants in $A_i$ to $A_1$ may be 0 or may not be 0, so the items corresponding to the constants being 0 do not exist, and the items corresponding to the constants not being 0 exist.

For example, there are only three items, which may be g(R)=c2*($A_3$*$R^3$+$A_2$$R^2$+$A_1$R)+b2.

For example, there are only two items, which may be g(R)=c2*($A_4$*$R^4$+$A_1$R)+b2.

In a case that the first function is N=int(a1*K/(c2*($A_i$*$R^i$+$A_{i-1}$$R^{i-1}$+ . . . +$A_1$R)+b2)), the specific target number is similar to the above, and will not be repeated here.

Second Embodiment:

In order to segment more accurately so that the boundary points may successfully capture the segment boundary, after the target number is determined, whether to segment according to the target number may depend on whether a preset condition is met. In response to a fact that the preset condition is met, the sequence to be coded is segmented according to the target number. In response to a fact that the condition is not met, the determined target number is adjusted, and the sequence to be coded is segmented according to the adjusted target number. Based on the foregoing embodiments, in an embodiment of the present application, before segmenting the sequence to be coded according to the target number, the method includes:

- determining a temporary value according to the length of the sequence to be coded and the target number;
- determining the proportional threshold corresponding to the transmission code rate according to the transmission code rate;
- determining whether the temporary value is greater than or equal to the proportional threshold;
- in response to determining that the temporary value is greater or equal to the proportional threshold, proceeding to a next step.

In an embodiment of the present application, before the segmentation, it may be determined whether to segment the sequence to be coded according to the target number.

Specifically, it is possible to determine a temporary value according to the length of the sequence to be coded and the target number at first, where the temporary value is the theoretical sub-length of each segment of the sequence to be coded after segmentation, i.e., a ratio determined according to the length of the sequence to be coded and the target number. The proportional threshold corresponding to the transmission code rate is determined according to the transmission code rate.

According to the magnitudes of the proportional threshold and the temporary value, it is determined whether to segment the sequence to be coded according to the target number.

If the temporary value is greater than or equal to the proportional threshold, the sequence to be coded is segmented according to the target number. If the temporary value is less than the proportional threshold, the target number needs to be adjusted, and the sequence to be coded is segmented according to the adjusted target number.

The first numerical value is stored in the sending end. When the temporary value is determined according to the length of the sequence to be coded and the target number, the second number may be determined according to the target number and the stored first numerical value. The ratio of the length of the sequence to be coded to the second quantity is determined as the temporary value. When the second number is determined according to the target number and the stored first numerical value, the sum of the target number and the first numerical value may be determined as the second number, or the difference between the target number and the first numerical value may be determined as the second number. The first numerical value may be 0, 1, 1, 1.5, or 2, or another numerical value, and preferably the first numerical value is 1.

If the first numerical value is 0, that is, the ratio of the length K of the sequence to be coded to the target number N is taken as the temporary value, where the temporary value=K/N. If the first numerical value is 1 and the difference between the target number and the first numerical value is determined as the second number which is N−1, the temporary value is the ratio of the length K of the sequence to be coded to the second number N−1, that is, the temporary value=K/(N−1).

The second scaling factor a2 is stored in the sending end. When the temporary value is determined according to the length K of the sequence to be coded and the target number N, the temporary value may be determined according to the length of the sequence to be coded, the target number and the second scaling factor. Specifically, it is possible to determine the second ratio of the length of the sequence to be coded to the target number at first, and determine the product of the second ratio and the second scaling factor as the temporary value. That is, the temporary value=a2*K/N. Alternatively, the difference between the target number and the first numerical value may also be determined as the second number, where the second number is N−1. The ratio of the length K of the sequence to be coded to the second number N−1 is determined, and the product of this ratio and the second scaling factor is determined as the temporary value, that is, the temporary value=a2*K/(N−1).

If the temporary value is less than the proportional threshold, the target number needs to be adjusted. When the target number is adjusted, it is possible to adjust the target number to be N−k or N+k, where k is an integer greater than 0, and preferably, k is 1.

Third Embodiment:

When the magnitudes of the temporary value and the proportional threshold are determined, the process of determining the proportional threshold may be different for different transmission code rates. On the basis of the foregoing embodiments, in an embodiment of the present application, said that determining the proportional threshold corresponding to the transmission code rate according to the transmission code rate includes:

- if the transmission code rate is less than a preset first code rate threshold, determining that the proportional threshold corresponding to the transmission code rate is a preset value.

In an embodiment of the present application, the first code rate threshold and the preset value are stored in the sending end. The proportional threshold corresponding to the transmission code rate may be determined according to the magnitudes of the transmission code rate and the first code rate threshold. If the transmission code rate is less than the preset first code rate threshold, it is determined that the proportional threshold corresponding to the transmission code rate is the preset value.

The first code rate threshold R1 may be any value greater than 0. When R is less than R1, the proportional threshold corresponding to R is the preset value. If R1 is greater than or equal to 1, it is considered that the corresponding proportional threshold is the preset value regardless of the transmission bit rate.

Preferably, the first code rate threshold is ⅕ or ⅖.

When the proportional threshold is determined for the transmission code rate, in an embodiment of the present application, the sending end may determine according to the saved preset second function. Specifically, said that determining the proportional threshold corresponding to the transmission code rate according to the transmission code rate includes:

- determining the proportional threshold corresponding to the transmission code rate according to the transmission code rate and a preset second function.

When the proportional threshold corresponding to the transmission code rate is determined according to the transmission code rate and the preset second function, it is possible to determine the proportional threshold according to the transmission code rate and a preset linear function c3*R+b3 or int (c3*R+b3) if the transmission code rate is not less than a preset second code rate threshold, where c3 is the maximum bit length to be coded, b3 is a preset third offset value, R is the transmission code rate, and int is rounding.

The second code rate threshold R2 may be any value less than or equal to 1. When R is greater than or equal to R2, the proportional threshold is determined according to the transmission code rate and the preset linear function c3*R+b3 or int (c3*R+b3).

If R2 is less than or equal to 0, it may be considered that the corresponding proportional threshold is determined according to the linear function c3*R+b3 or int (c3*R+b3) regardless of value of the transmission code rate.

Preferably, the second code rate threshold is ⅕ or ⅖.

If R1=R2 and 0<R1<1 and 0<R2<1; when R<R1, the corresponding proportional threshold is the preset value; when R≥R1, the corresponding proportional threshold is determined according to the linear function c3*R+b3 or int (c3*R+b3).

When the proportional threshold corresponding to the transmission code rate is determined according to the transmission code rate and the preset second function, it is also possible to determine the proportional threshold according to the transmission code rate and a preset linear function c4*R+b4 or int (c4*R+b4) if the transmission code rate is not less than a preset third code rate threshold and less than a preset fourth bit rate threshold, where c4 is the maximum bit length to be coded, b4 is a preset fourth offset value, R is the transmission code rate, and int is rounding.

The third code rate threshold R3 is less than the fourth code rate threshold R4. On this basis, R3 may be any value less than 1, and the fourth code rate threshold R4 may be any value greater than 0. When R3≤R<R4, the corresponding proportional threshold is determined according to the linear function c4*R+b4 or int (c4*R+b4).

If R3 is 0 and R4 is 1, it may be considered that the corresponding proportional threshold is determined according to the linear function c4*R+b4 or int (c4*R+b4) regardless of value of the transmission code rate.

It may also be: R1=R3, R2=R4, 0<R1<1, 0<R2<1, 0<R3<1 and 0<R4<1; when R<R1, the corresponding proportional threshold is the preset value;
when R1≤R<R2, the corresponding proportional threshold is determined according to the linear function c3*R+b3 or int (c3*R+b3);
when R≥R2, the corresponding proportional threshold is determined according to the linear function c4*R+b4 or int (c4*R+b4).

It may also be: R1=R3, 0<R1<1, 0<R3<1 and 0<R4<1;
when R<R1, the corresponding proportional threshold is the preset value;
when R1≤R<R4, the corresponding proportional threshold is determined according to the linear function c4*R+b4 or int (c4*R+b4).

It may also be: R2=R3, 0<R2<1, 0<R3<1 and 0<R4<1;
when R≥R2, the corresponding proportional threshold is determined according to the linear function c3*R+b3 or int (c3*R+b3);
when R3≤R<R2, the corresponding proportional threshold is determined according to the linear function c4*R+b4 or int (c4*R+b4).

According to the above description, the determined relationship between the transmission code rate R and the proportional threshold in the following table may be obtained, where R1 is the first code rate threshold, R2 is the second code rate threshold, R3 is the third code rate threshold, and R4 is the fourth code rate threshold.

| Transmission Code Rate R | Proportional Threshold |
|---|---|
| R < R1 | Preset Value |
| R ≥ R2 | c3*R + b3 or int (c3*R + b3) |
| R3 ≤ R < R4 | c4*R + b4 or int (c4*R + b4) |

The following is a specific embodiment of the segmentation:

```
N=ceil(M/1024) where M= K/R
    If R <=1/5
        Ksegthr=370
    Else if 1/5<R <=2/5
        Ksegthr=1024*R +150
    End
```

That is, when the code rate is less than or equal to 0.2, the preset value Ksegthr=370 may be used for segmentation; when the code rate is greater than 0.2 and less than or equal to 0.4, the linear function Ksegthr=1024*R+150 is used for segmentation.

It is assumed that the length of the sequence to be coded is K=543*4=2172 bits, and the transmission code rate R=0.4.

Figure 5:
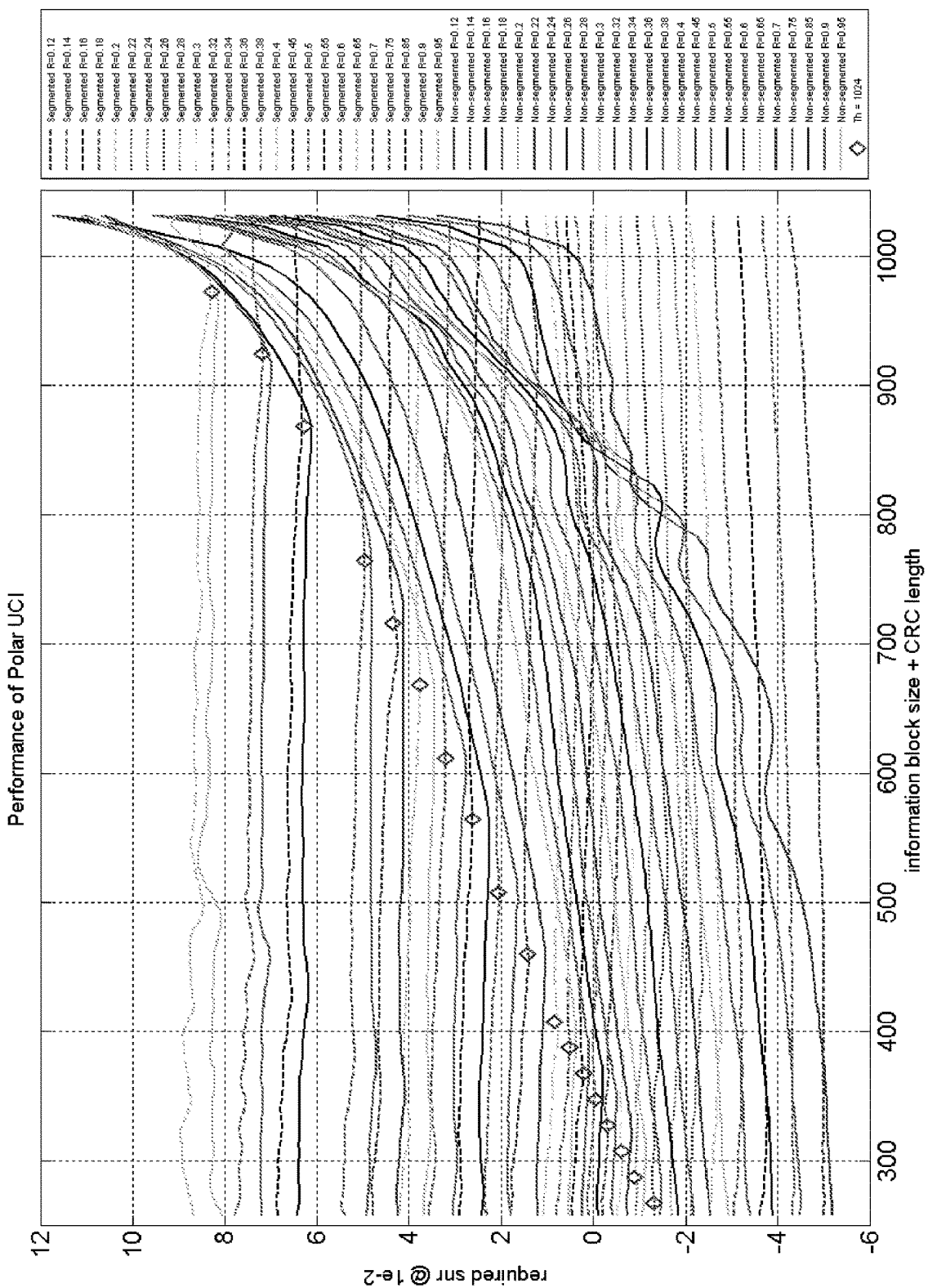
FIG. 5 is a schematic diagram of a segmentation provided by an embodiment of the present application.

When the target number of segments of the sequence to be coded is determined, it may be determined according to N=ceiling(K/(1024*R)), so the target number of segments of the sequence to be coded is N=ceiling(2172/(1024*0.4))=6, thus the sequence to be coded may be directly divided into 6 segments. The above example is to segment the coded bit number M=K/R by using the maximum mother code length of 1024. FIG. 5 is an example of only two segments using N=ceiling(K/(1024*R)), where the diamonds represent the boundary points.

Figure 6:
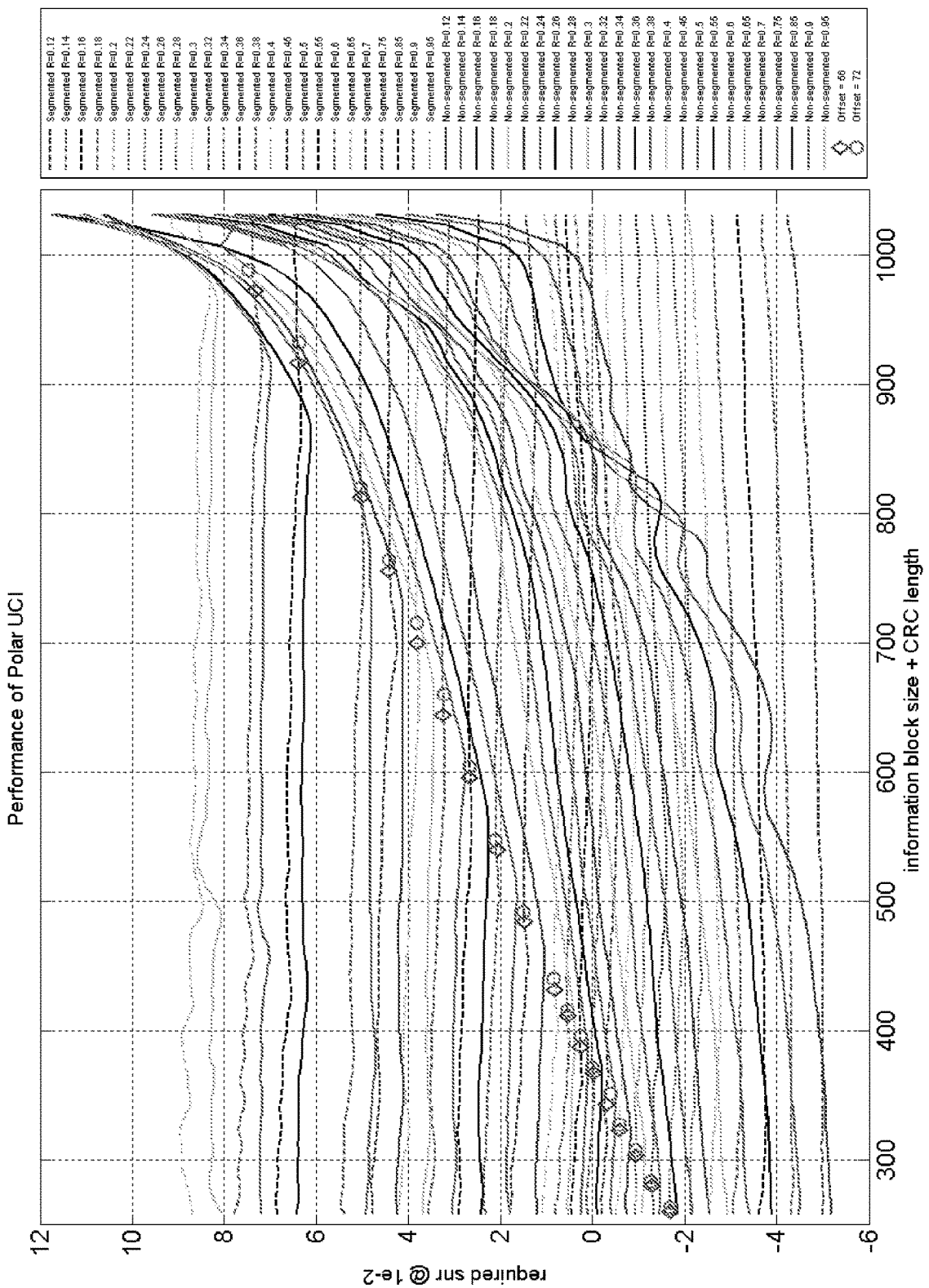
FIG. 6 is a schematic diagram of a segmentation provided by an embodiment of the present application.

When the target number of segments of the sequence to be coded is determined, it may be determined according to N=ceiling(K/(1024*R+b)), where b=56 or 72. When b=56, the target number of the segments of the sequence to be coded is N=ceiling(2172/(1024*0.4+56))=6; when b=72, the target number of the segments of the sequence to be coded is N=ceiling(2172/(1024*0.4+72))=6. The above example is to segment the coded bit number M=K/R by using the length of 1024+b/R. FIG. 6 is an example using N=ceiling(K/(1024*R+b)) and offset=56 or 72. In this example, there are only two segments at most, where the diamonds represent the boundary points when b is 56, and the circles represent the boundary points when b is 72.

The above is to directly segment the sequence to be coded according to the determined target number. In order to make the segmentation more accurate and capture the boundary points more precisely, it is also possible to determine the relationship between the segmentation temporary value and the proportional threshold after determining the target number N, and determine whether to update the target number according to the transmission code rate.

Specifically, it is possible to calculate the specific value of N according to N=ceiling(K/(1024*R)) at first, and determine the temporary value after obtaining the specific value of N. According to the magnitudes of the temporary value and the proportional threshold as well as the transmission code rate, it is determined whether to divide into N segments or N−1 segments.

The following is another specific embodiment of the segmentation:

---

N=ceil(M/1024) where M= K/R
If R <=1/5
    Ksegthr=370
Else if 1/5<R
    Ksegthr=832*R+200
End

---

That is, when the code rate is less than or equal to 0.2, the preset value Ksegthr=370 may be used for segmentation; when the code rate is greater than 0.2, the linear function Ksegthr=832*R+200 is used for segmentation.

Figure 7:
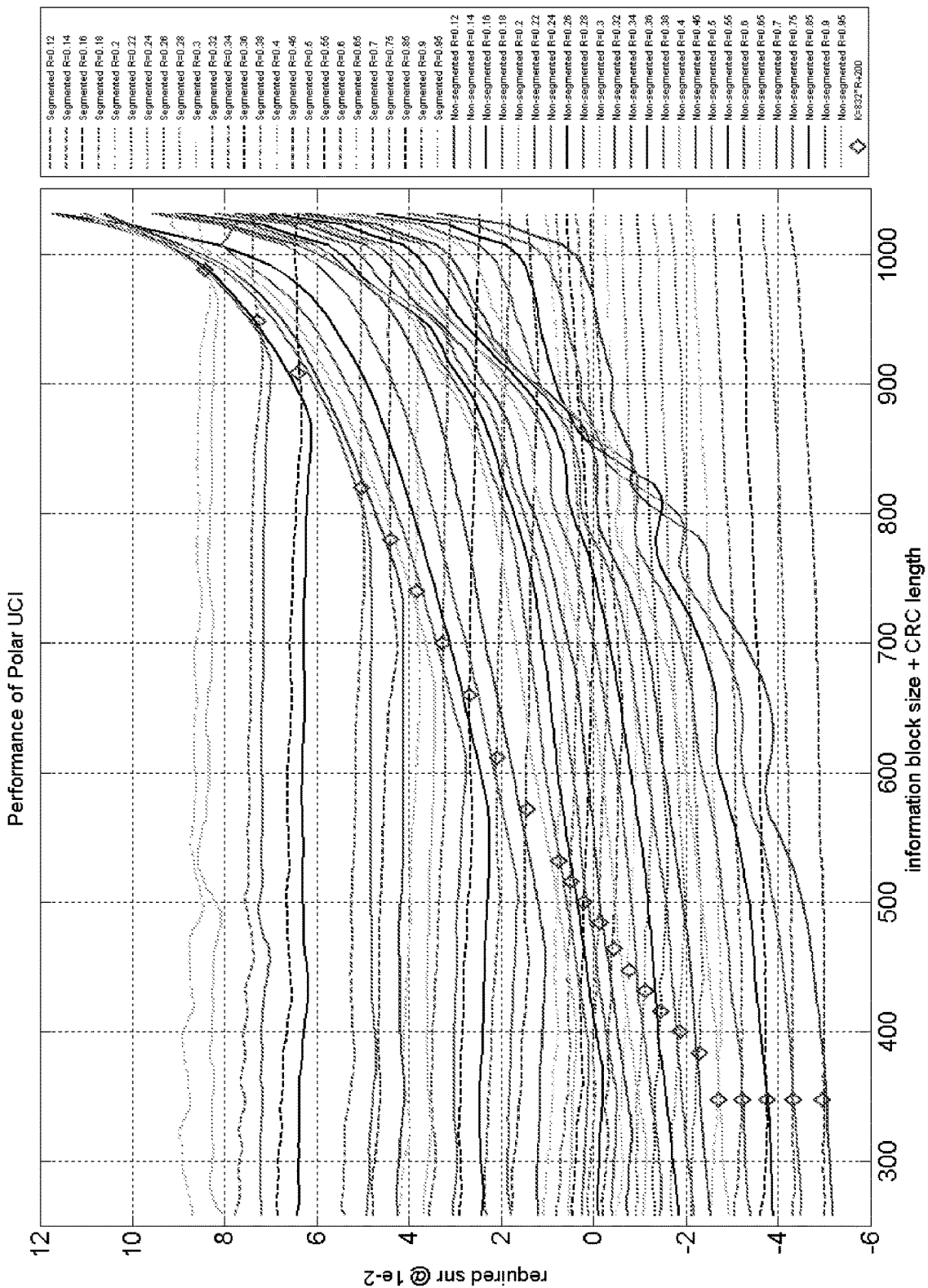
FIG. 7 is a schematic diagram of a segmentation provided by an embodiment of the present application.

FIG. 7 is a schematic diagram of the segmentation according to the foregoing embodiment, where the boundary points successfully capture the segmentation boundary.

Fourth Embodiment:

In the Long Term Evolution (LTE) system, the Uplink Control CHannel (PUCCH) is used to transmit the synchronized UCI, where the UCI transmitted on the PUCCH includes an uplink Scheduling Request (SR), the downlink Hybrid Automatic Retransmission Query ACKnowledge (HARQ-ACK) information, and the periodic Channel Quality Indicator (CQI) information of the UE. In order to ensure that the receiving end can check the accuracy of the received UCI, the sending end may attach a CRC sequence for checking behind the UCI information sequence before coding the UCI. In an embodiment of the present application, the sequence to be coded is segmented and coded. Specifically, it is possible to perform segmentation at first, followed by CRC attachment, or it is possible to perform CRC attachment at first, followed by segmentation. Based on the above embodiments, in an embodiment of the present application, said that segmenting the sequence to be coded according to the target number includes:

determining a target sequence according to the sequence to be coded;

segmenting the target sequence according to the target number, where the target sequence is an information sequence, or a sequence consisting of an information sequence and a CRC sequence.

Specifically, in the segmentation, if the CRC sequence is attached behind the UCI information sequence (information bits) to obtain the UCI payload and then the code block segmentation is performed on the UCI payload, there is a need to determine the target sequence according to the sequence to be coded when the sequence to be coded is the UCI information sequence. The target sequence is the UCI payload obtained after the CRC sequence is attached to the UCI information sequence (information bits); the sequence to be coded may be directly used as the target sequence when the sequence to be coded itself includes the UCI information sequence and the CRC sequence for checking.

Alternatively, in the segmentation, the code block segmentation is performed on the UCI information sequence (information bits) at first, where each segment is added with a CRC sequence of L bits, then the polar coding is performed on each segment of bit stream added with the CRC, the rate matching operation is performed respectively on coded code blocks, and finally the code blocks are concatenated to get the final output. Then, when the sequence to be coded is the UCI information sequence, the sequence to be coded may be directly used as the target sequence, and the target sequence is segmented by using the target number; when the sequence to be coded itself includes the UCI information sequence and the CRC sequence for checking, the CRC sequence needs to be removed from the sequence to be coded, and the obtained UCI information sequence is used as the target sequence to thereby perform the segmentation.

Fifth Embodiment:

On the basis of the above embodiments, when the segmentation is performed, it may be uniform segmentation or non-uniform segmentation; or may be uniform segmentation after zero padding.

If the sequence to be coded is segmented, the uniform segmentation or the non-uniform segmentation or the uniform segmentation after zero padding may be performed on the sequence to be coded.

If the target sequence is segmented, the uniform segmentation or the non-uniform segmentation or the uniform segmentation after zero padding may be performed on the target sequence.

Figure 4:
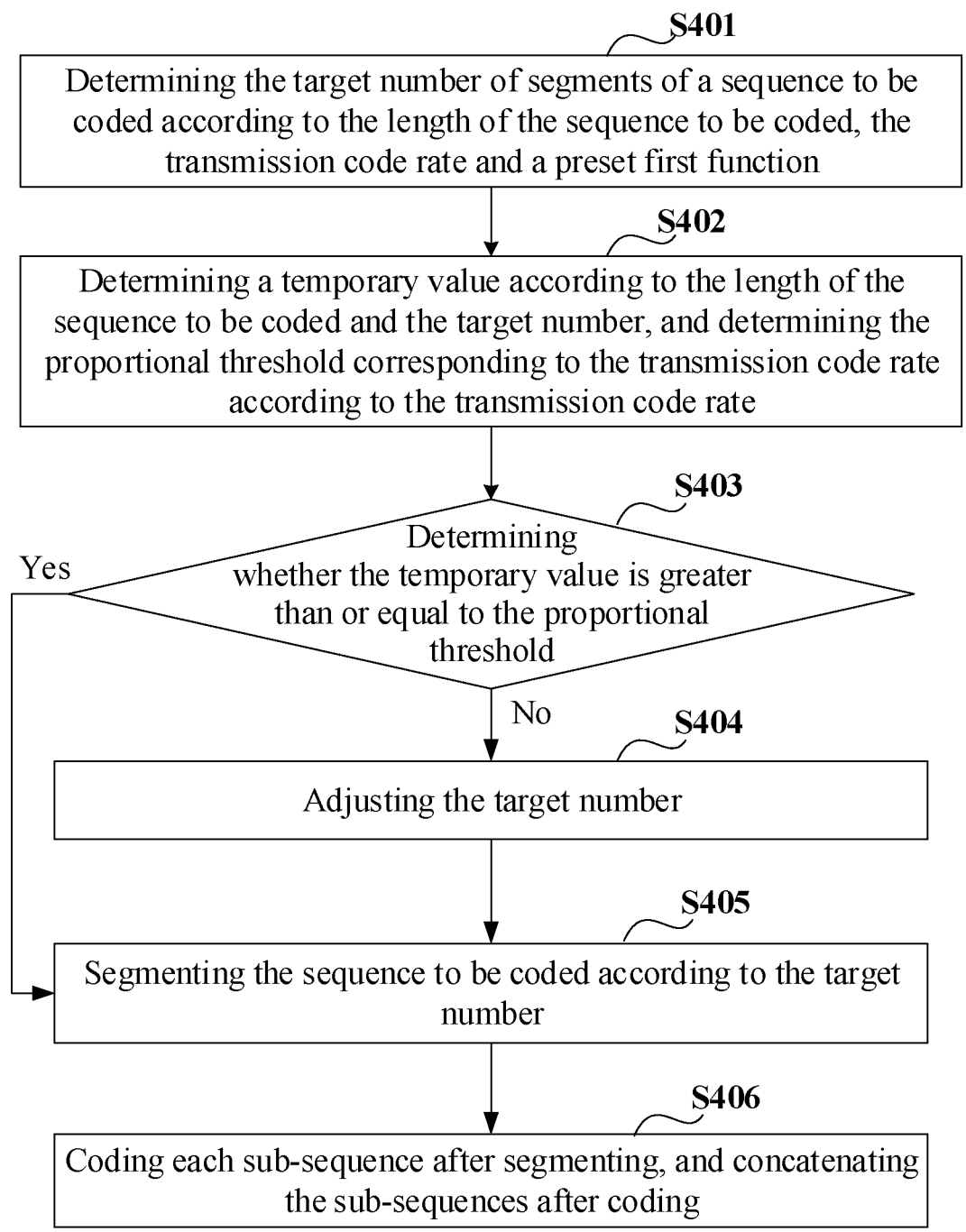
FIG. 4 is a schematic diagram of a coding process provided by an embodiment of the present application.

FIG. 4 is a schematic diagram of a coding process provided by an embodiment of the present application. The process includes the following steps.

S401: determining the target number of segments of a sequence to be coded according to the length of the sequence to be coded, the transmission code rate and a preset first function.

S402: determining a temporary value according to the length of the sequence to be coded and the target number, and determining the proportional threshold corresponding to the transmission code rate according to the transmission code rate.

S403: determining whether the temporary value is greater than or equal to the proportional threshold, if so, proceeding to S405; if not, proceeding to S404.

S404: adjusting the target number, and proceeding to S405 according to the adjusted target number.

S405: segmenting the sequence to be coded according to the target number.

S406: coding each sub-sequence after segmenting, and concatenating the sub-sequences after coding.

Figure 8:
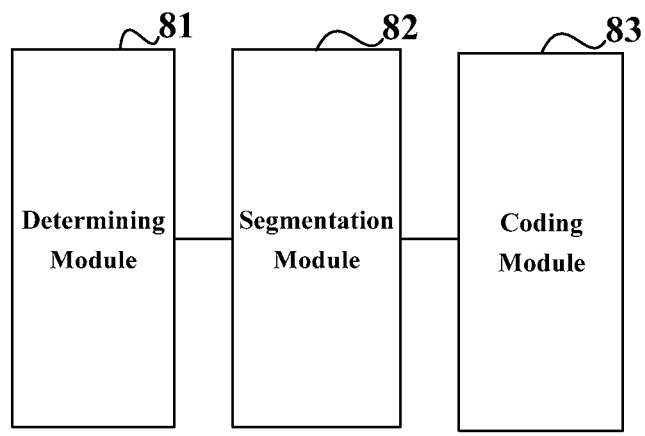
FIG. 8 is a structural diagram of a coding apparatus provided by an embodiment of the present application.

Sixth Embodiment:

FIG. 8 is a structural diagram of a coding device provided by an embodiment of the present application. The device includes:

a determining module 81 configured to determine the target number of segments of a sequence to be coded according to the length of the sequence to be coded and the transmission code rate;

a segmentation module 82 configured to segment the sequence to be coded according to the target number;

a coding module 83 configured to code each sub-sequence obtained after segmenting, and concatenate the sub-sequences after coding.

Optionally, the determining module 81 is further configured to determine a temporary value according to the length of the sequence to be coded and the target number; and determine the proportional threshold corresponding to the transmission code rate according to the transmission code rate;

the apparatus further includes:

a determining module configured to determine whether the temporary value is greater than or equal to the proportional threshold;

if so, trigger the segmentation module 82.

The determining module 81 is specifically configured to: determine a second number according to the target number and a preset first numerical value, and determine the ratio of the length of the sequence to be coded to the second number as the temporary value; or determine the second ratio of the length of the sequence to be coded to the target number, and determine the product of the second ratio and a preset second scaling factor as the temporary value.

The apparatus further includes:

an update module configured to adjust the target number.

The determining module 81 is specifically configured to: determine that the proportional threshold corresponding to the transmission code rate is a preset value if the transmission code rate is less than a preset first code rate threshold.

The determining module 81 is specifically configured to: determine the proportional threshold corresponding to the transmission code rate according to the transmission code rate and a preset second function.

The determining module 81 is specifically configured to: determine the proportional threshold according to the transmission code rate and a preset linear function c3*R+b3 or int (c3*R+b3) if the transmission code rate is not less than a preset second code rate threshold, where c3 is the maximum bit length to be coded, b3 is a preset third offset value, R is the transmission code rate, and int is rounding.

The determining module 81 is specifically configured to: determine the proportional threshold according to the transmission code rate and a preset linear function c4*R+b4 or int (c4*R+b4) if the transmission code rate is not less than a preset third code rate threshold and less than a preset fourth bit rate threshold, where c4 is the maximum bit length to be coded, b4 is a preset fourth offset value, R is the transmission code rate, and int is rounding.

The segmentation module 82 is specifically configured to: determine a target sequence according to the sequence to be coded; and segment the target sequence according to the target number, where the target sequence is an information sequence, or a sequence consisting of an information sequence and a CRC sequence.

Figure 9:
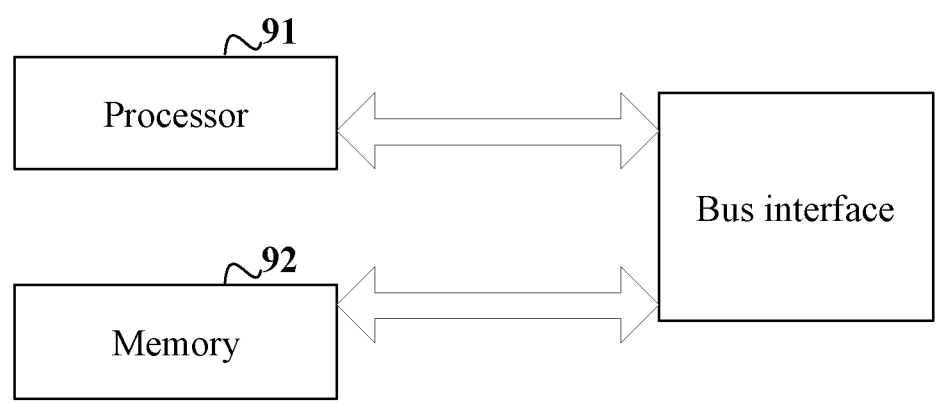
FIG. 9 is an electronic device provided by an embodiment of the present application.

Seventh Embodiment:

FIG. 9 is an electronic device provided by an embodiment of the present application. The electronic device includes: a memory 92 and a processor 91.

The processor 91 is configured to read programs in the memory to perform the process of:

determining the target number of segments of a sequence to be coded according to the length of the sequence to be coded and the transmission code rate;

segmenting the sequence to be coded according to the target number;

coding each sub-sequence obtained after segmenting, and concatenating the sub-sequences after coding.

The processor 91 is specifically configured to: determine the target number of segments of the sequence to be coded according to the length of the sequence to be coded, the transmission code rate and a preset first function.

The processor 91 is further configured to: determine a temporary value according to the length of the sequence to be coded and the target number before segmenting the sequence to be coded according to the target number; determine the proportional threshold corresponding to the transmission code rate according to the transmission code rate; determine whether the temporary value is greater than or equal to the proportional threshold; in response to determining that the temporary value is greater than or equal to the proportional threshold, proceed to a next step.

The processor 91 is specifically configured to: determine a second number according to the target number and a preset first numerical value, and determine the ratio of the length of the sequence to be coded to the second number as the temporary value; or determine the second ratio of the length of the sequence to be coded to the target number, and determine the product of the second ratio and a preset second scaling factor as the temporary value.

The processor 91 is further configured to: adjust the target number before segmenting the sequence to be coded according to the target number if the temporary value is less than the proportional threshold.

The processor 91 is specifically configured to: determine that the proportional threshold corresponding to the transmission code rate is a preset value if the transmission code rate is less than a preset first code rate threshold.

The processor 91 is specifically configured to: determine the proportional threshold corresponding to the transmission code rate according to the transmission code rate and a preset second function.

The processor 91 is specifically configured to: determine the proportional threshold according to the transmission code rate and a preset linear function c3*R+b3 or int (c3*R+b3) if the transmission code rate is not less than a preset second code rate threshold, where c3 is the maximum bit length to be coded, b3 is a preset third offset value, R is the transmission code rate, and int is rounding.

The processor 91 is specifically configured to: determine the proportional threshold according to the transmission code rate and a preset linear function c4*R+b4 or int (c4*R+b4) if the transmission code rate is not less than a preset third code rate threshold and less than a preset fourth bit rate threshold, where c4 is the maximum bit length to be coded, b4 is a preset fourth offset value, R is the transmission code rate, and int is rounding.

The processor 91 is specifically configured to: determine a target sequence according to the sequence to be coded; and segment the target sequence according to the target number, where the target sequence is an information sequence, or a sequence composed of an information sequence and a CRC sequence.

As shown in FIG. 9, it is a structural schematic diagram of an electronic device provided by an embodiment of the present application. Here, in FIG. 9, the bus architecture may include any numbers of interconnected buses and bridges, and specifically link various circuits of one or more processors represented by the processor 91 and the memory represented by the memory 92. The bus architecture may further link various other circuits such as peripheral device, voltage regulator and power management circuit, which are all well known in the art and thus will not be further described again herein. The bus interface provides an interface. The processor 91 is responsible for managing the bus architecture and general processing, and the memory 92 may store the data used by the processor 91 when performing the operations.

Eighth Embodiment:

A computer readable storage medium, where the computer readable storage medium stores a computer program executable by an electronic device, where the program, when running on the electronic device, causes the electronic device to perform the steps of:

determining the target number of segments of a sequence to be coded according to the length of the sequence to be coded and the transmission code rate;

segmenting the sequence to be coded according to the target number;

coding each sub-sequence obtained after segmenting, and concatenating the sub-sequences after coding.

Optionally, said that determining the target number of segments of a sequence to be coded according to the length of the sequence to be coded and the transmission code rate, includes:

determining the target number of segments of the sequence to be coded according to the length of the sequence to be coded, the transmission code rate and a preset first function.

Optionally, the preset first function includes:

an integer of $N=a1*K/g(R)$, where the $g(R)$ is a linear function or a nonlinear function, a1 is a first scaling factor, K is the length of the sequence to be coded, R is the transmission code rate, and N is the target number.

Optionally, when the $g(R)$ is a linear function, the $g(R)=c1*R+b1$, where c1 is the maximum bit length to be coded, and b1 is a preset first offset value.

Optionally, when the $g(R)$ is a nonlinear function, the $g(R)=c2*(A_i*R^i+A_{i-1}R^{i-1}+\ldots+A_1R)+b2$, where c2 is the maximum bit length to be coded, b2 is a preset second offset value, i is a preset constant not less than 2, and $A_i$–$A_1$ are preset constants.

Optionally, before segmenting the sequence to be coded according to the target number, the method includes:
determining a temporary value according to the length of the sequence to be coded and the target number;
determining the proportional threshold corresponding to the transmission code rate according to the transmission code rate;
determining whether the temporary value is greater than or equal to the proportional threshold;
in response to determining that the temporary value is greater than or equal to the proportional threshold, proceeding to a next step.

Optionally, said that determining a temporary value according to the length of the sequence to be coded and the target number, includes:
determining the second number according to the target number and a preset first numerical value, and determining the ratio of the length of the sequence to be coded to the second number as the temporary value; or
determining the second ratio of the length of the sequence to be coded to the target number, and determining the product of the second ratio and a preset second scaling factor as the temporary value.

Optionally, the first numerical value is 1.

Optionally, if the temporary value is less than the proportional threshold, before segmenting the sequence to be coded according to the target number, the method further includes:
adjusting the target number.

Optionally, said that determining the proportional threshold corresponding to the transmission code rate according to the transmission code rate includes:
if the transmission code rate is less than a preset first code rate threshold, determining that the proportional threshold corresponding to the transmission code rate is a preset value.

Optionally, said that determining the proportional threshold corresponding to the transmission code rate according to the transmission code rate includes:
determining the proportional threshold corresponding to the transmission code rate according to the transmission code rate and a preset second function.

Optionally, said that determining the proportional threshold corresponding to the transmission code rate according to the transmission code rate and a preset second function, includes:
if the transmission code rate is not less than a preset second code rate threshold, determining the proportional threshold according to the transmission code rate and a preset linear function $c3*R+b3$ or $int(c3*R+b3)$, where c3 is the maximum bit length to be coded, b3 is a preset third offset value, R is the transmission code rate, and int is rounding.

Optionally, said that determining the proportional threshold corresponding to the transmission code rate according to the transmission code rate and a preset second function, includes:
if the transmission code rate is not less than a preset third code rate threshold and less than a preset fourth bit rate threshold, determining the proportional threshold according to the transmission code rate and a preset linear function $c4*R+b4$ or $int(c4*R+b4)$, where c4 is the maximum bit length to be coded, b4 is a preset fourth offset value, R is the transmission code rate, and int is rounding.

Optionally, the scaling factor is greater than 0 and less than or equal to 1.

Optionally, the offset value is greater than −150 and less than 200.

Optionally, the segmenting the sequence to be coded according to the target number includes:
determining a target sequence according to the sequence to be coded;
segmenting the target sequence according to the target number, where the target sequence is an information sequence, or a sequence composed of an information sequence and a CRC sequence.

Optionally, the segmentation includes:
uniform segmentation; or
non-uniform segmentation; or
uniform segmentation after zero padding.

The embodiments of the present application provide a coding method and apparatus, an electronic device and a storage medium, so as to solve the problem of non-flexible segmentation of the sequence to be coded in the prior art. The method includes: determining the target number of segments of a sequence to be coded according to the length of the sequence to be coded and the transmission code rate; segmenting the sequence to be coded according to the target number; coding each sub-sequence obtained after segmenting, and concatenating the sub-sequences after coding. In the embodiments of the present application, the target number of segments of the sequence to be coded is determined according to the length of the sequence to be coded and the transmission code rate, and the sequence to be coded is segmented according to the target number. The sequence to be coded is flexibly segmented to improve the coding performance.

For the system/apparatus embodiments, they are substantially similar to the method embodiments, so the description thereof is relatively simple, and the related parts may refer to the partial illustration of the method embodiments.

It should be noted that the relational terms such as first and second herein are only used to distinguish one entity or operation from another and do not necessarily require or imply any such actual relationship or sequence between these entities or operations.

It should be understood by those skilled in the art that the embodiments of the present application may be provided as methods, systems and computer program products. Thus the present application can take the form of hardware embodiments alone, software embodiments alone, or embodiments combining the software and hardware aspects. Also the present application can take the form of computer program products implemented on one or more computer usable storage mediums (including but not limited to magnetic disk memories, CD-ROMs, optical memories and the like) containing computer usable program codes therein.

The present application is described by reference to the flow charts and/or the block diagrams of the methods, the devices (systems) and the computer program products according to the embodiments of the present application. It should be understood that each process and/or block in the flow charts and/or the block diagrams, and a combination of processes and/or blocks in the flow charts and/or the block diagrams can be implemented by the computer program instructions. These computer program instructions can be provided to a general-purpose computer, a dedicated computer, an embedded processor, or a processor of another programmable data processing device to produce a machine, so that an apparatus for implementing the functions specified in one or more processes of the flow charts and/or one or more blocks of the block diagrams is produced by the instructions executed by the computer or the processor of another programmable data processing device.

These computer program instructions can also be stored in a computer readable memory which is capable of guiding the computer or another programmable data processing device to operate in a particular way, so that the instructions stored in the computer readable memory produce a manufacture including the instruction apparatus which implements the functions specified in one or more processes of the flow charts and/or one or more blocks of the block diagrams.

These computer program instructions can also be loaded onto the computer or another programmable data processing device, so that a series of operation steps are performed on the computer or another programmable device to produce the computer-implemented processing. Thus the instructions executed on the computer or another programmable device provide steps for implementing the functions specified in one or more processes of the flow charts and/or one or more blocks of the block diagrams.

Although the preferred embodiments of the present application have been described, those skilled in the art can make additional alterations and modifications to these embodiments once they learn about the basic creative concepts. Thus the attached claims are intended to be interpreted to include the preferred embodiments as well as all the alterations and modifications falling within the scope of the present application.

Evidently those skilled in the art can make various modifications and variations to the embodiments of the present application without departing from the spirit and scope of the embodiments of the present application. Thus the present application is also intended to encompass these modifications and variations therein as long as these modifications and variations to the embodiments of the present application come into the scope of the claims of the present application and their equivalents.

What is claimed is:

1. A coding method, comprising:
    determining a target quantity of segments of a sequence to be coded according to a length of the sequence to be coded, a transmission code rate and a preset first function; wherein the preset first function comprises:
    an integer of $N=a1*K/g(R)$, wherein the $g(R)$ is a linear function or a nonlinear function, a1 is a first scaling factor, K is the length of the sequence to be coded, R is the transmission code rate, and N is the target quantity;
    performing segmentation on the sequence to be coded according to the target quantity;
    coding each sub-sequence obtained after segmentation; and
    concatenating sub-sequences after coding.

2. The method of claim 1, wherein when the $g(R)$ is a linear function, the $g(R)=c1*R+b1$, wherein c1 is a maximum bit length to be coded, and b1 is a preset first offset value.

3. The method of claim 1, wherein when the $g(R)$ is a nonlinear function, the $g(R)=c2*(Ai*Ri+Ai-1Ri-1+ \ldots +A1R)+b2$, wherein c2 is a maximum bit length to be coded, b2 is a preset second offset value, i is a preset constant not less than 2, and Ai–A1 are preset constants.

4. The method of claim 1, wherein before performing segmentation on the sequence to be coded according to the target quantity, the method further comprises:
    determining a temporary value according to the length of the sequence to be coded and the target quantity;
    determining a proportional threshold corresponding to the transmission code rate according to the transmission code rate;
    determining whether the temporary value is greater than or equal to the proportional threshold; and
    in response to determining that the temporary value is greater than or equal to the proportional threshold, performing segmentation on the sequence to be coded according to the target quantity.

5. The method of claim 4, wherein said that determining a temporary value according to the length of the sequence to be coded and the target quantity, comprises:
    determining a second quantity according to the target quantity and a preset first numerical value, and determining a ratio of the length of the sequence to be coded to the second quantity as the temporary value; or
    determining a second ratio of the length of the sequence to be coded to the target quantity, and determining a product of the second ratio and a preset second scaling factor as the temporary value.

6. The method of claim 4, wherein in a case that determining a second quantity according to the target quantity and a preset first numerical value, and determining a ratio of the length of the sequence to be coded to the second quantity as the temporary value, the first numerical value is 1.

7. The method of claim 4, wherein if the temporary value is less than the proportional threshold, before performing segmentation on the sequence to be coded according to the target quantity, the method further comprises:
    adjusting the target quantity.

8. The method of claim 4, said that determining a proportional threshold corresponding to the transmission code rate according to the transmission code rate comprises:
    if the transmission code rate is less than a preset first code rate threshold, determining that the proportional threshold corresponding to the transmission code rate is a preset value.

9. The method of claim 4, wherein said that determining a proportional threshold corresponding to the transmission code rate according to the transmission code rate, comprises:
    determining the proportional threshold corresponding to the transmission code rate according to the transmission code rate and a preset second function.

10. The method of claim 9, wherein said that determining the proportional threshold corresponding to the transmission code rate according to the transmission code rate and a preset second function, comprises:
    if the transmission code rate is not less than a preset second code rate threshold, determining the proportional threshold according to the transmission code rate and a preset linear function $c3*R+b3$ or int $(c3*R+b3)$ which serves as the second function, wherein c3 is a maximum bit length to be coded, b3 is a preset third offset value, R is the transmission code rate, and int is rounding.

11. The method of claim 9, wherein said that determining the proportional threshold corresponding to the transmission code rate according to the transmission code rate and a preset second function, comprises:

if the transmission code rate is not less than a preset third code rate threshold and less than a preset fourth bit rate threshold, determining the proportional threshold according to the transmission code rate and a preset linear function $c4*R+b4$ or int $(c4*R+b4)$ which serves as the second function, wherein c4 is a maximum bit length to be coded, b4 is a preset fourth offset value, R is the transmission code rate, and int is rounding.

12. The method of claim 1, wherein the scaling factor is greater than 0 and less than or equal to 1.

13. The method of claim 2, wherein the offset value is greater than −150 and less than 200.

14. The method of claim 1, wherein said that performing segmentation on the sequence to be coded according to the target quantity, comprises:

determining a target sequence according to the sequence to be coded; and performing segmentation on the target sequence according to the target quantity, wherein the target sequence is an information sequence, or a sequence consisting of an information sequence and a Cyclic Redundancy Check, CRC, sequence.

15. The method of claim 1, wherein the segmentation comprises:

uniform segmentation; or non-uniform segmentation; or uniform segmentation after zero padding.

16. A computer readable storage medium, wherein the computer readable storage medium stores a computer program executable by an electronic device, wherein the program causes the electronic device to perform steps of the method of claim 1 when running on the electronic device.

17. An electronic device, comprising: a memory and a processor;

the processor is configured to read programs in the memory to perform a process of:

determining a target quantity of segments of a sequence to be coded according to a length of the sequence to be coded, a transmission code rate and a preset first function; wherein the preset first function comprises:

an integer of $N=a1*K/g(R)$, wherein the g(R) is a linear function or a nonlinear function, a1 is a first scaling factor, K is the length of the sequence to be coded, R is the transmission code rate, and N is the target quantity;

performing segmentation on the sequence to be coded according to the target quantity;

coding each sub-sequence obtained after segmenting; and concatenating sub-sequences after coding.

* * * * *